(12) United States Patent
Plaisted et al.

(10) Patent No.: US 10,442,688 B1
(45) Date of Patent: Oct. 15, 2019

(54) IONIZATION CHAMBER DESIGNED TO ENHANCE COVALENT BONDING OF ATOMIC ELEMENTS FOR THE RELEASE OF RAW HYDROGEN AND TO ELIMINATE WASTE WATER IN THE PROCESS

(71) Applicant: Kenneth Stephen Bailey, Pinole, CA (US)

(72) Inventors: Robert Plaisted, Santa Clarita, CA (US); Eric Arno Vigen, Calabasas, CA (US); Kenneth Stephen Bailey, Pinole, CA (US)

(*) Notice: Subject to any disclaimer, the term of this patent is extended or adjusted under 35 U.S.C. 154(b) by 0 days.

(21) Appl. No.: 15/963,603

(22) Filed: Apr. 26, 2018

(51) Int. Cl.
| | | |
|---|---|---|
| C01B 3/00 | (2006.01) | |
| C01B 3/04 | (2006.01) | |
| H05H 1/24 | (2006.01) | |
| B01J 19/08 | (2006.01) | |
| C02F 1/46 | (2006.01) | |

(52) U.S. Cl.
CPC ............ *C01B 3/042* (2013.01); *B01J 19/088* (2013.01); *C02F 1/4608* (2013.01); *H05H 1/24* (2013.01); *B01J 2219/0877* (2013.01); *B01J 2219/0894* (2013.01); *C01B 2203/0861* (2013.01)

(58) Field of Classification Search
USPC ............... 204/241, 242, 252, 274; 205/628; 422/186
See application file for complete search history.

(56) References Cited

U.S. PATENT DOCUMENTS

| | | | | |
|---|---|---|---|---|
| 2009/0038958 | A1* | 2/2009 | Coyle | B01J 4/002 205/628 |
| 2010/0209311 | A1* | 8/2010 | Mills | B01J 19/088 422/186.03 |
| 2011/0259757 | A1* | 10/2011 | Vancina | C01B 3/042 205/628 |
| 2012/0199472 | A1* | 8/2012 | Curfew | C25B 1/04 204/241 |

FOREIGN PATENT DOCUMENTS

| | | | | |
|---|---|---|---|---|
| KR | 0170929 B1 | * | 1/1999 | ............... C25B 1/04 |
| WO | WO-0238827 A1 | * | 5/2002 | ............ C23C 16/50 |

OTHER PUBLICATIONS

Mizuno et al. "Confirmation of Anomalous Hydrogen Generation by Plasma Electrolysis", 4th Meeting of Japan, CF Research Society (Year: 2003).*

* cited by examiner

*Primary Examiner* — Nina Bhat

(57) ABSTRACT

An ionization chamber is disclosed that can free ions in water creating polarized atoms of hydrogen and oxygen derived from water in the process. The water can be comprised of non-potable waste water. Once the hydrogen and oxygen ions are released, and polarized in the process, the electrons can be aligned such that the end product is the release of hydrogen and the bonding of the oxygen with the free electrons of the other element(s) such as Titanium or Tungsten for example, without high heat or pressure as is normally required. The chamber is comprised of a series of metallic rods, a series of solid nickel mesh plates, a vacuum pump, a dual pulsed D.C. Power supply (from 200-800 VDC pulsed and a low power, −24 VDC pulsed at 400-600 Hz.), a water bath chamber, a ceramic or Teflon encapsulated feeder assembly, and an R.F. Pulse generator.

6 Claims, 10 Drawing Sheets

An idealized representation of a solution of a 1:1 electrolyte

The first solvation shell of a sodium ion dissolved in water. The oxygen atoms are arranged at the vertices of an octahedron with the sodium ion at its center.

| Property | Gas | Plasma |
|---|---|---|
| ↙ 300 | ↙ 301 | ↙ 302 |
| Electrical conductivity | Very low: Air is an excellent insulator until it breaks down into plasma at electric field strengths above 30 kilovolts per centimeter. | Usually very high: For many purposes, the conductivity of a plasma may be treated as infinite. |
| Independently acting species | One: All gas particles behave in a similar way, influenced by gravity and by collisions with one another. | Two or three: Electrons, ions, protons and neutrons can be distinguished by the sign and value of their charge so that they behave independently in many circumstances, with different bulk velocities and temperatures, allowing phenomena such as new types of waves and instabilities. |
| Velocity distribution | Maxwellian: Collisions usually lead to a Maxwellian velocity distribution of all gas particles, with very few relatively fast particles. | Often non-Maxwellian: Collisional interactions are often weak in hot plasmas and external forcing can drive the plasma far from local equilibrium and lead to a significant population of unusually fast particles. |
| Interactions | Binary: Two-particle collisions are the rule, three-body collisions extremely rare. | Collective: Waves, or organized motion of plasma, are very important because the particles can interact at long ranges through the electric and magnetic forces. |

Comparison of plasma and gas phases

Figure 3.

| Common forms of plasma Artificially produced ↓ 400 | Terrestrial plasmas ↓ 401 | Space and astrophysical plasmas ↓ 402 |
|---|---|---|
| Those found in plasma displays, including TV screens.<br>Inside fluorescent lamps (low energy lighting), neon signs<br>Rocket exhaust and ion thrusters<br>The area in front of a spacecraft's heat shield during re-entry into the atmosphere<br>Inside a corona discharge ozone generator<br>Fusion energy research<br>The electric arc in an arc lamp, an arc welder or plasma torch<br>Plasma ball (sometimes called a plasma sphere or plasma globe)<br>Arcs produced by Tesla coils (resonant air core transformer or disruptor coil that produces arcs similar to lightning, but with alternating current rather than static electricity)<br>Plasmas used in semiconductor device fabrication including reactive-ion etching, sputtering, surface cleaning and plasma-enhanced chemical vapor deposition<br>Laser-produced plasmas (LPP), found when high power lasers interact with materials.<br>Inductively coupled plasmas (ICP), formed typically in argon gas for optical emission spectroscopy or mass spectrometry<br>Magnetically induced plasmas (MIP), typically produced using microwaves as a resonant coupling method<br>Static electric sparks | Lightning<br>St. Elmo's fire<br>Upper-atmospheric lightning (e.g. Blue jets, Blue starters, Gigantic jets, ELVES)<br>Sprites<br>The ionosphere<br>The plasma-sphere<br>The polar aurorae<br>The polar wind, a plasma fountain | The Sun and other stars (plasmas heated by nuclear fusion)<br>The solar wind<br>The interplanetary medium (space between planets)<br>The interstellar medium (space between star systems)<br>The intergalactic medium (space between galaxies)<br>The Io-Jupiter flux tube<br>Accretion discs<br>Interstellar nebulae |

Figure 4.

End to End System Components

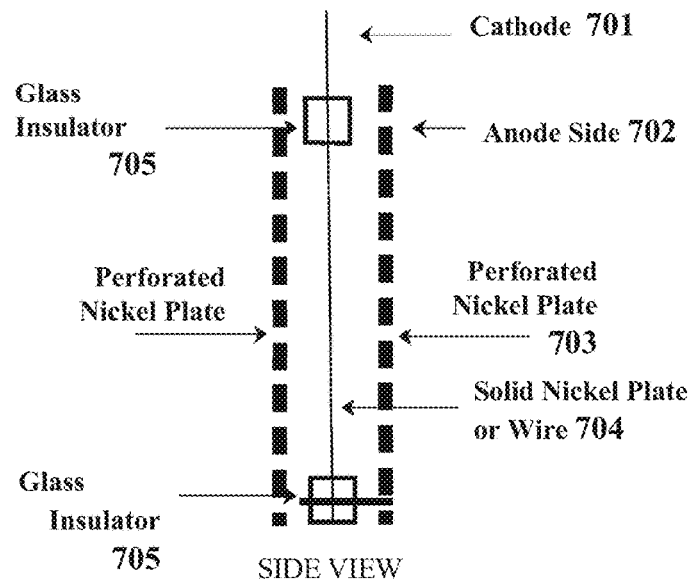
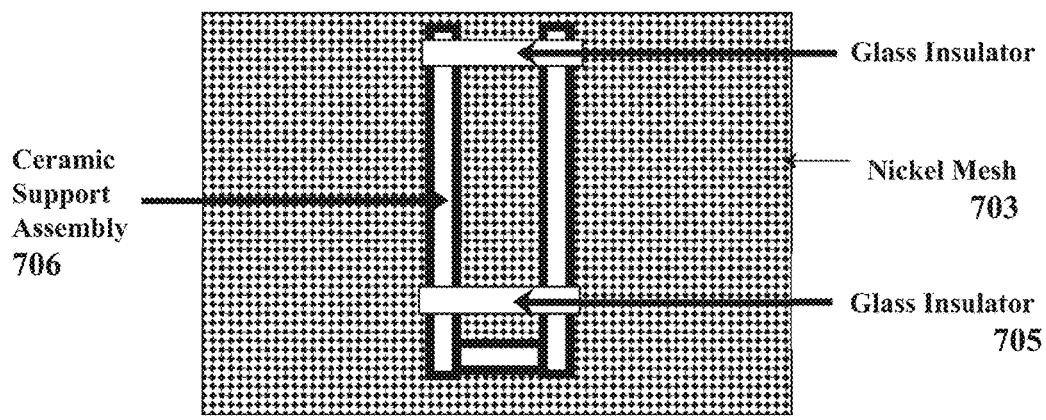
Figure 7.

IONIZATION CHAMBER DESIGNED TO ENHANCE COVALENT BONDING OF ATOMIC ELEMENTS FOR THE RELEASE OF RAW HYDROGEN AND TO ELIMINATE WASTE WATER IN THE PROCESS

CROSS-REFERENCE TO RELATED APPLICATIONS

N/A

BACK GROUND OF THE INVENTION

A description of Debye-Hiickel theory includes a very detailed discussion of the assumptions and their limitations as well as the mathematical development and applications. A snapshot of a 2-dimensional section of an idealized electrolyte solution as depicted in FIG. 1 of the present invention. The ions are shown as spheres with unit electrical charge. The solvent (pale blue) is shown as a uniform medium, without structure. On average, each ion is surrounded more closely by ions of opposite charge than by ions of like charge. These concepts were developed into a quantitative theory involving ions of charge ze and Z,€, where z can be any integer. The principal assumption is that departure from ideality is due to electrostatic interactions between ions, mediated by Coulomb's law: the force of interaction between two electric charges, separated by a distance, r in a medium of relative permittivity ¢ sub r is given.

In an ideal electrolyte solution the activity coefficients of all the ions are equal to one. Ideality of electrolyte solution can be achieved only in very dilute solutions. Non-ideality of more concentrated solutions arises principally (but not exclusively) because ions of opposite charge attract each other due to electrostatic forces, while ions of the same charge repel each other. In consequence ions are not randomly distributed throughout the solution, as they would be in an ideal solution. By generating a plasma, the charged particles can be controlled and steered in a variety of ways including magnetically.

Activity coefficients of single ions cannot be measured experimentally because an electrolyte solution must contain both positively charged ions and negatively charged ions. Instead, a mean activity coefficient, is defined as (v). For example, with the electrolyte NaCl v=(Na+Cl—)1/2 as depicted in FIG. 2 in the present invention.

The process of ionic bonding otherwise known as electrovalent bonding is heretofore a well-known process. What has not been practiced in prior teachings is the release of hydrogen gas without a separation bladder to prevent the oxygen (O) gas that has been freed in the plasma process from contaminating the released hydrogen and causing an explosive potential. In fact, other teachings show the sequestering of the oxygen product of the electrolysis being sequestrated by various forms of carbon under high heat and under extreme pressure which releases toxic carbon dioxide into the atmosphere in the process, whereas the present teaching does not. In the present invention the highly charged oxygen atoms readily combine with the metal particles of the metal rods to form (in the case of Titanium rods) Titanium Dioxide. $TiO_2$ is commonly used in cosmetics, paints and even some foods for coloration enhancement (more commonly known as Pigment White 6-PW6). The production method of Titanium Dioxide typically is through the use of Ilmenite mixed with sulfuric acid. In this process the Rutile (as it is called) is further refined with pure oxygen or plasma at 1500-2000 degrees K.

In the present invention a series of shrouded metal rods comprised of the same type of metal are set in a feeder assembly to act as one side (anode side) of an ionic generator wherein the cathode side of the generator is comprised of a like numbered series of perforated solid nickel plates separated by a similar number of solid metal nickel plates that are polarized as neutral. The cathode and anode are charged with a variable 400 to 800 volts D.C. and a pulse generator pulses the signal at or between 400 to 600 Hz utilizing an R.F. modulated signal, where the entire assembly is designed to be submerged in water within a ceramic coated chamber wherein a circulatory pump stirs the liquid in the bottom of the tank, while a vacuum of approximately 15 inches of mercury or in other words about 0.5 atmospheres draws off the subject H2 (hydrogen gasses).

In the present teachings the pure Oxygen released in the ionic chamber readily combines with the Titanium atoms and can be easily extracted using a recirculation pump at close to room temperatures. The metal rods can also be comprised of other metals such as Tungsten wherein the Tungsten for example combines with the pure Oxygen to give a resulting Tungsten Trioxide or WO3. This compound is also typically found as a pigment in paints due to its' rich yellow color. $WO_3$ is also used in x-ray screen phosphors as well as fireproofing of fabrics. In recent years $WO_3$ has been used for electrochromic windows or smart windows in an electrically switchable glass when a voltage is applied to tint or occlude the window. $WO_3$ is also used in semiconductor manufacturing for conduction of electrons in a process known as doping. WO3 is typically produced by the use of Hydrochloric acid at temperatures of 1800 degrees K. In the present invention again the WO3 can be drawn off at room temperature with a recirculation pump.

In the present invention the byproduct of the above two examples utilizing tungsten rods and titanium rods is the release of raw pure hydrogen from the process which can be used as fuel for energy or heat in several various applications including combustion in a piston type reciprocating or turbine engine.

BRIEF DESCRIPTION OF THE DRAWINGS

FIG. 3. Depicts the Properties of Gas versus Plasma in the present invention.

FIG. 4. Depicts the three types of plasmas found in the known Universe today.

FIG. 7. Depicts the cathode side plate array as might be found in the preferred embodiment of the present invention for example.

FIG. 11. Depicts four stages of static bond separation methods which have been development to date.

DETAILED DESCRIPTION

Figure 1:
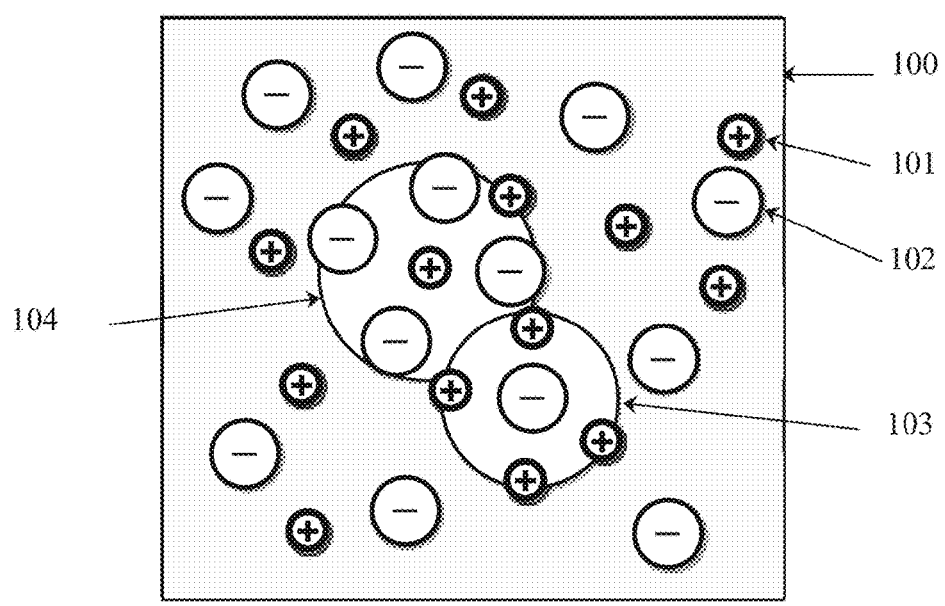
FIG. 1. Depicts an idealized ionization of electrons in a 1:1 electrolyte bath of water for example as might be found in the present invention for example.

FIG. 1 depicts an idealized solution (100) representing a 1:1 ratio of electrolyte in an ionic solution solute which is totally disassociated in that the positive ions (101) are spherical and not polarized by the surrounding electric field. The solvation of ions is ignored except that the solvent plays no role except as the dialectic constant (relative permittivity), between the negatively charged electrons (102) and the balanced molecules of oxygen (103) and the balanced molecules of hydrogen (104) as depicted in the drawing.

Figure 2:
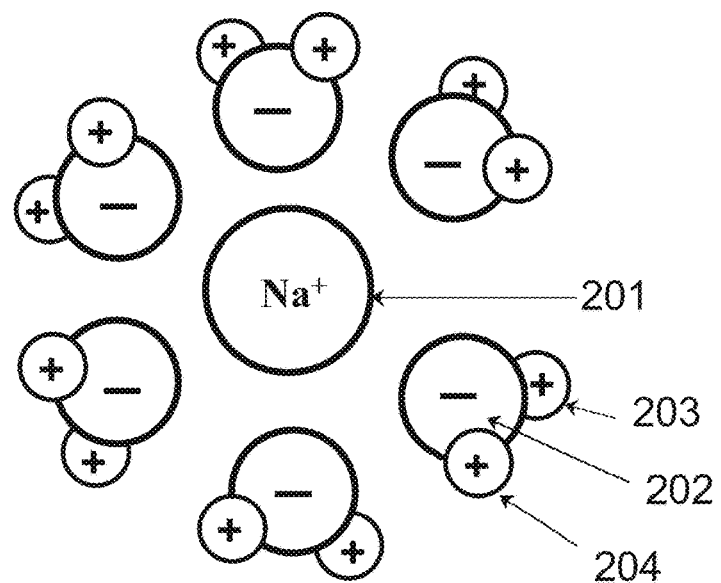
FIG. 2. Depicts the solvation of a sodium ion dissolved in water for example to show how the electrons align themselves in an octahedron formation with the sodium ion at the center for example.

FIG. 2 depicts the first solvation shell of the sodium ion (201) as might be found in brine water, sur-49 rounded by the oxygen molecules (202) and their complementing charged particles (203) and (204) for example as might be found in the preferred embodiment of the present invention prior to any interaction with the magnets or their magnetic fields.

FIG. 3 depicts the various properties (300) of the gaseous state (301) and the plasma state (302) which constitute the variations between the third and fourth forms of matter as known in physics for example as might be found in the preferred embodiment of the present invention. Those properties include but are not limited to Electrical Conductivity, Independent Acting Species, Velocity Distribution, and Interactions for example.

FIG. 4 depicts the common forms of plasma as found in nature (400), the terrestrial created plasmas found in nature (401) and the astrophysical plasma states found in space (402), for example as might be found in the preferred embodiment of the present invention for example. These include Common Forms of Plasma Artificially Produced (as in the present invention), Terrestrial Plasmas, and Space and Astrophysical Plasmas for example.

Figure 5:
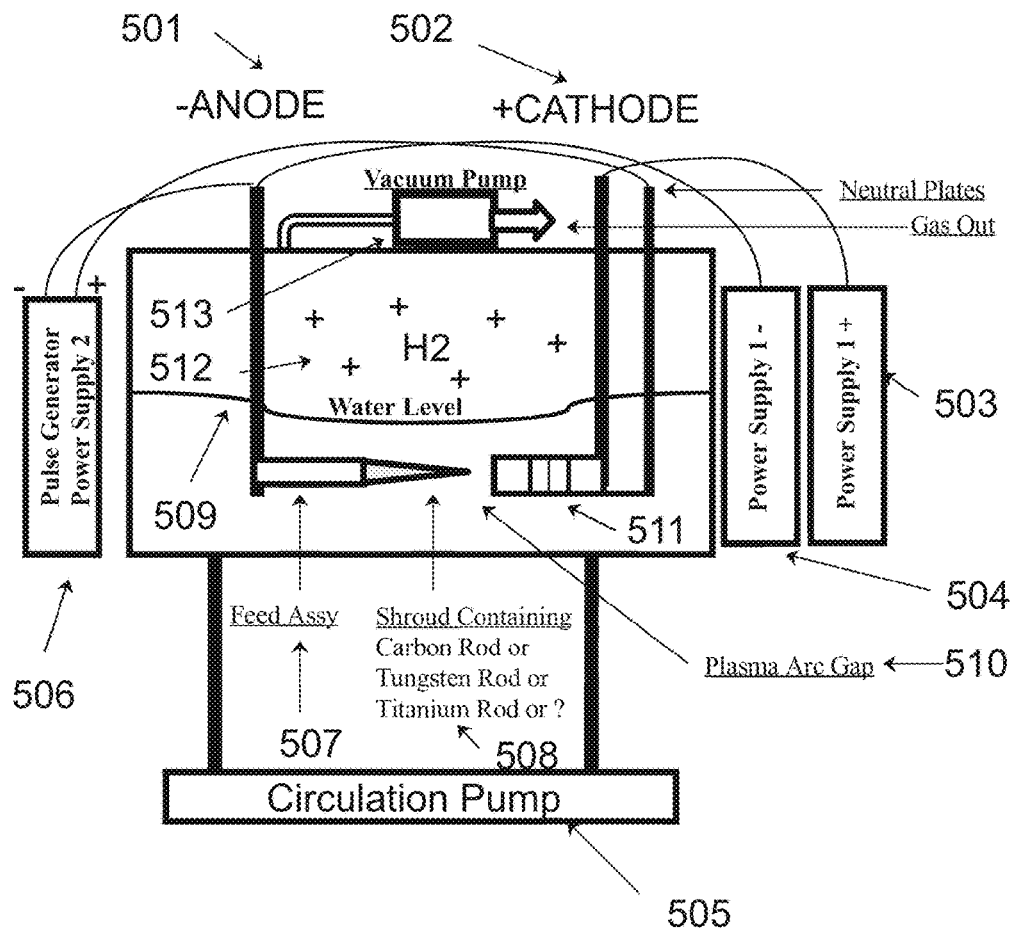
FIG. 5. Depicts the End to End system components of the present invention as may be found for example in the preferred embodiment of the present invention.

FIG. 5 depicts the end to end system components as might be found in the preferred embodiment of the present invention for example, comprising the Anode part (501), the Cathode part (502), the positive power supply (503), the negative power supply (504), the recirculation pump and filter (505), the pulse modulated power supply (506), the shrouded feed assembly (507) comprising the carbon rods, the tungsten rods, and the titanium rods (508), further comprising the aqueous water level (509) in the vessel which acts as an electrical shunt plasma arc gap (510) between the shroud and the described staggered metal perforated nickel plates (511) further comprising the hydrogen gas release chamber (512), and the hydrogen vacuum pump (513). Those components include a water bath crucible, a high voltage power supply, a low voltage pulsed power supply, a water circulation pump, an Anode (−) feed assembly, a cathode (+) stacked nickel plate array, and a hydrogen gas output port, for example.

Figure 6:
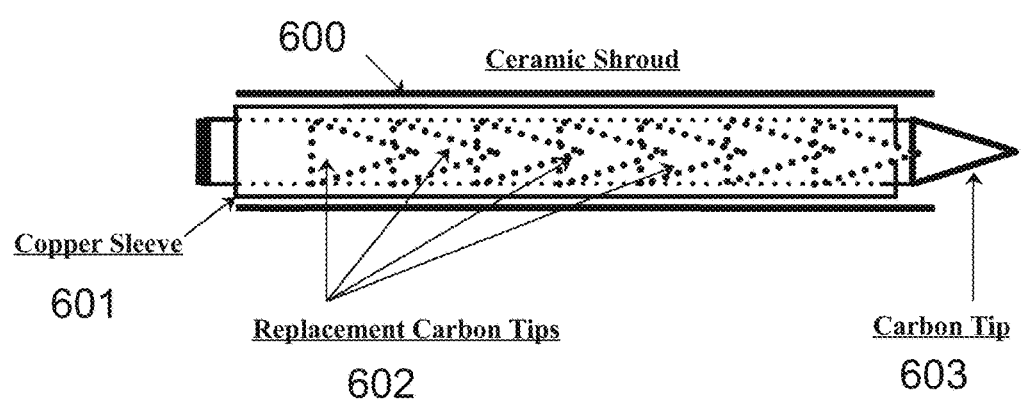
FIG. 6. Depicts the anode side feed assembly as might be found in the preferred embodiment of the present invention for example.

FIG. 6 depicts a detailed view of the ceramic shroud (600) for example as might be found in the preferred embodiment of the present invention, further comprising the copper sleeve (601), containing the replacement tips (602), which are designed to replace the main tip (603) on a periodic basis as for this example. The assembly includes a ceramic shroud to house the component parts, including a copper sleeve, and a number of carbon tips used as replacements for spent carbon tips, and a mounting assembly for example as might be found in the present invention for example.

FIG. 7 depicts the nickel plate assembly from both the side view and back inside view for example as might be found in the preferred embodiment of the present invention for example, further comprising the Cathode part (701) comprised of a filament part of solid nickel wire or nickel plate (704), and an Anode part (702) comprising two solid metal perforated nickel plates (703), for example, on either side of the Cathode part, protected from the Cathode part by a glass or ceramic insulator (705) the glass insulator part being supported by a ceramic or glass support part (706) and thereby comprising the entire are flashpoint design which is the subject of the present invention. The cathode side includes two perforated nickel plates sandwiched onto a solid nickel plate in the middle of the two perforated plates that are insulated from each other by glass insulators mounted on a ceramic support assembly for example as might be found in the present invention for example.

Figure 8:
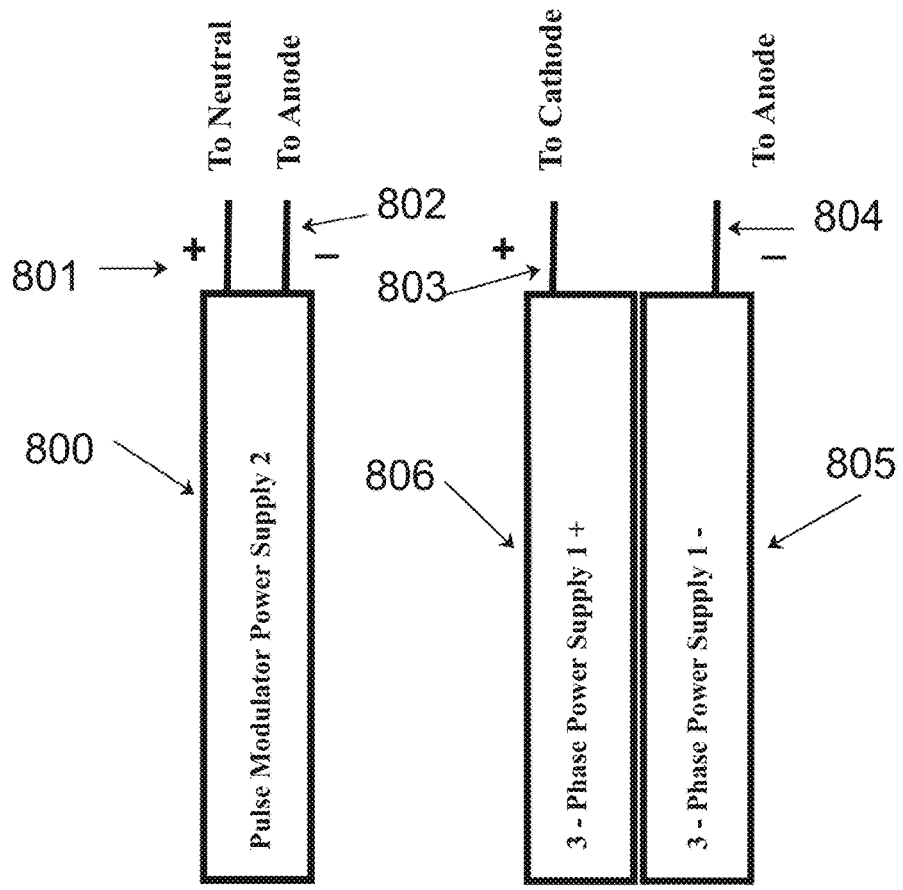
FIG. 8. Depicts the components found in the power supply of the present invention for example as might be found in the preferred embodiment.

FIG. 8 depicts the various components of the three phase power supply parts (801) and (805) and (806) as might be found in the preferred embodiment of the present invention for example, comprising the said neutral leg (801) of the pulse modulated low voltage power supply, the anode leg (802) of the pulse modulated low voltage power supply part, the cathode side of the high voltage power supply (803), and the anode side of the high voltage power supply (804). Those components include a 200-800 variable D.C. power supply for the pulsed arc-voltage, a low power −24-volt D.C. pulsed power supply, which has a pulse width modulated output of both D.C. as well as modulated R.F., as might be found in the preferred embodiment of the present invention for example.

Figure 9:
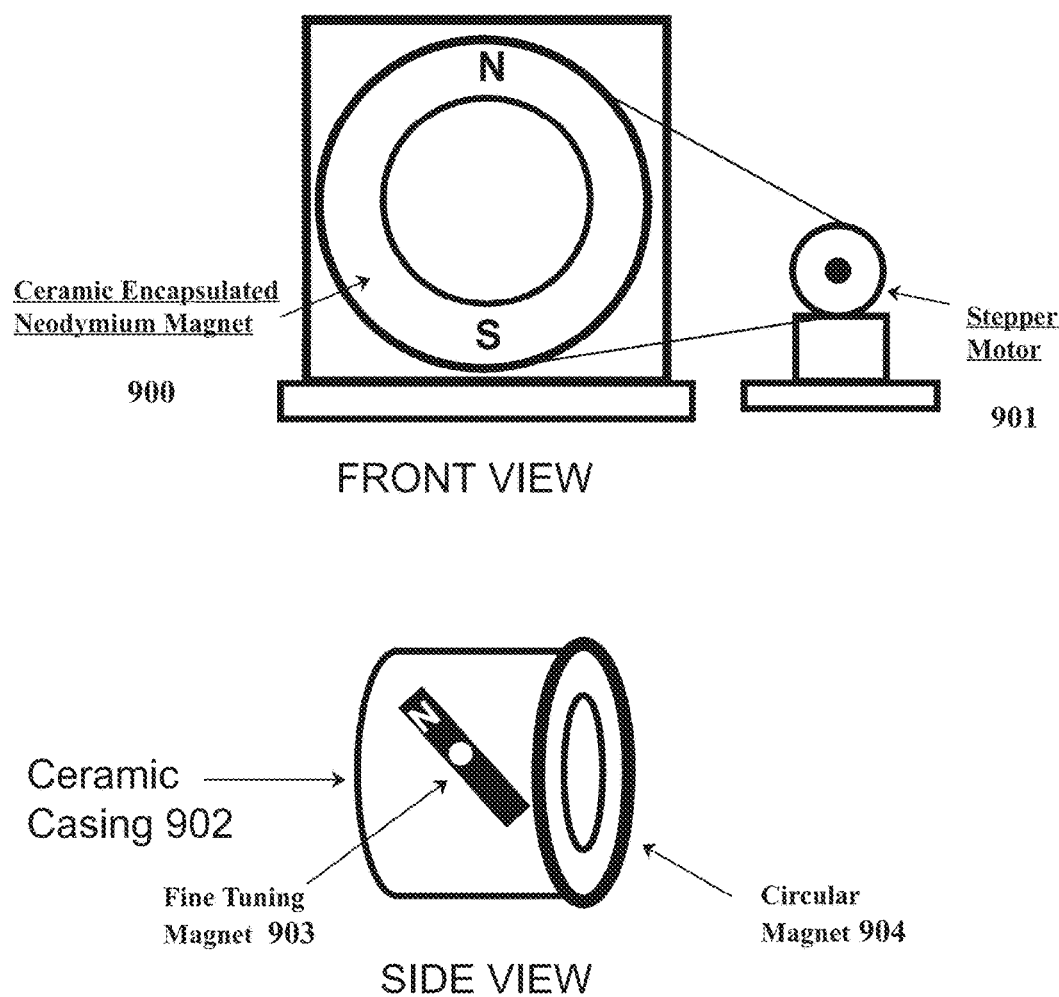
FIG. 9. Depicts the detailed drawing of the rotating magnetic cage as might be found in the preferred embodiment of the present invention for example.

FIG. 9 depicts detailed drawing of the rotating magnetic cage as might be found in the preferred embodiment of the present invention for example, comprising the encapsulated neodymium magnet (900), the attached stepper motor (901) further depicting a side view of the assembly comprising the ceramic casing (902) further comprising the fine-tuning magnet (903), and the circular neodymium magnet (904), for example. The front view depicts the stepper motor and drive used to rotate the magnet around it's' axis to the desired best orientation for the highest plasma field effect possible. The side view depicts the trimmer magnets that can be rotated and positioned for the optimal deflection of ions required for the intended purpose.

Figure 10:
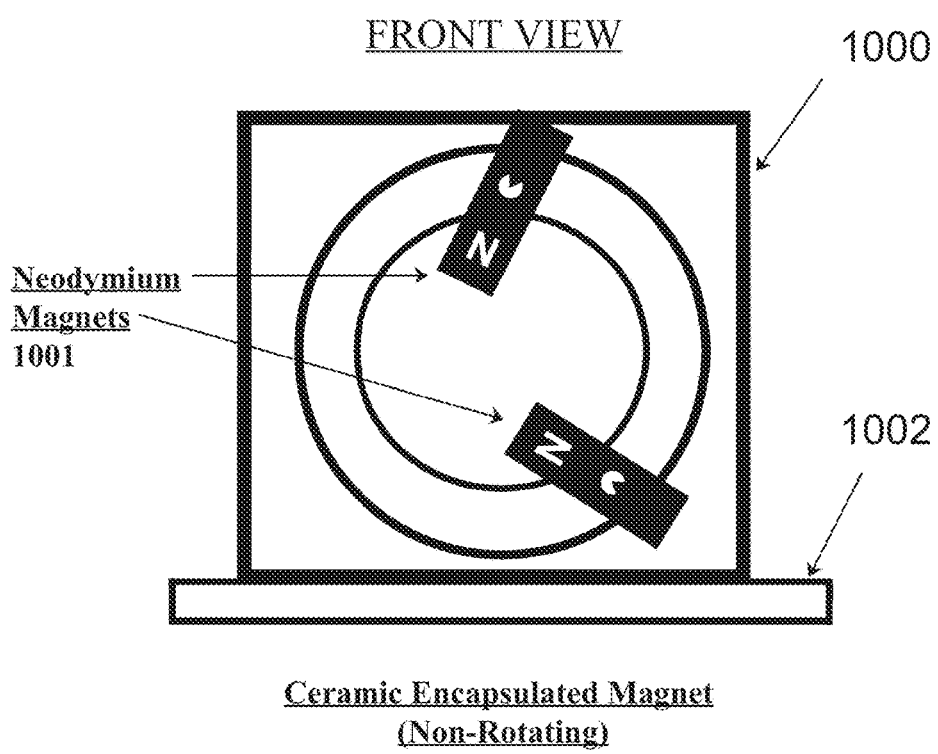
FIG. 10. Depicts the front view of the rotating magnet depicted in FIG. 9 showing an alternate approach.

FIG. 10 depicts the alternate neodymium magnet approach within the sealed housing (1000), comprising the two adjustable neodymium vertical magnets (1001), and the support bracket for the entire assembly (1002) as shown for example.

Regarding FIG. 11, shows four stages of static bond separation methods which have been developed to date and their relativity which are:

1. The use of electrolysis without a catalyst such as KOH or TiO and Platinum as co-catalysts has a low chemical reaction rate, but does generate small volumes of hydrogen.
2. Electrolysis with a catalytic additive such as KOH (potassium hydroxide) which accelerates the process by both more atom interaction, to create a chemical reaction at a higher rate.
3. Plasma Arc with Prior Electrolysis and catalytic additive—Creating the highest of the ionic chemical reaction rates.

4. Magnetically Steered—Plasma with Plasma, Electrolysis and Catalytic additive, the present invention, generates a chemical reaction ionic rate at the greatest volume of the above three approaches.
5. The other two for commercial production of hydrogen not discussed here are in the use of high heat or extreme pressure.

We claim:

1. A system for generating hydrogen in a sealed ionization chamber by plasma ionization of water comprising:
   a sealed ionization chamber comprising water disposed within said chamber;
   a plurality of submerged anode and cathode metal rods within said chamber;
   a gap between said anode and cathode for generating plasma upon energizing;
   a pulsed DC power source and a lower powered VDC source in operative connection with said anode and cathode for creating a plasma arc and ionizing the water to produce hydrogen ions;
   a circulation pump in operative connection with said ionization chamber;
   an inlet to introduce water into said chamber; and
   a hydrogen outlet for the removal of hydrogen from said sealed ionization chamber.

2. The system for generating hydrogen in a sealed ionization chamber of claim 1, further comprising an RF plus generator for modulating the frequency of between the anode and cathode for enhanced hydrogen generation while minimizing the amount of oxygen produced during ionization.

3. The system for generating hydrogen in a sealed ionization chamber of claim 1, wherein the anode is a metal rod selected from the group consisting of carbon, tungsten and titanium; wherein the anode includes a plurality of self-feeding tips and the anode further comprises a copper shroud.

4. The system for generating hydrogen in a sealed ionization chamber of claim 1, wherein the anode is selected from insulated rod comprising a bundle of carbon or titanium or tungsten; or perforated nickel plate.

5. The system for generating hydrogen in a sealed ionization chamber of claim 1, wherein the cathode is selected from a series of nickel stacked perforated plates or thin replaceable metal wire.

6. The system for generating hydrogen in a sealed ionization chamber of claim 1, further comprising a rotating neodymium magnetic assembly operatively connected to a plastic encapsulated electric motor submerged within said water within said ionization chamber for removal of debris created during plasma arc ionization between said anode and cathode.

* * * * *